United States Patent
Trant

(10) Patent No.: US 7,359,813 B2
(45) Date of Patent: Apr. 15, 2008

(54) OUTLIER SCREENING TECHNIQUE

(75) Inventor: Eric Wheeler Trant, Little Elm, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 11/512,817

(22) Filed: Aug. 30, 2006

(65) Prior Publication Data

US 2008/0065338 A1  Mar. 13, 2008

(51) Int. Cl.
*G06F 19/00* (2006.01)

(52) U.S. Cl. .................. 702/81; 702/84; 702/185

(58) Field of Classification Search ............... 702/81, 702/84, 181, 182, 185; 700/21, 28, 108, 700/51, 110
See application file for complete search history.

(56) References Cited

U.S. PATENT DOCUMENTS

| | | | |
|---|---|---|---|
| 6,400,173 B1 | 6/2002 | Shimizu et al. | |
| 6,727,723 B2 | 4/2004 | Shimizu et al. | |
| 6,792,385 B2* | 9/2004 | Parker et al. | 702/179 |
| 2002/0171449 A1 | 11/2002 | Shimizu et al. | |
| 2003/0083762 A1 | 5/2003 | Farrah et al. | |
| 2004/0002844 A1* | 1/2004 | Jess et al. | 703/14 |
| 2004/0175850 A1 | 9/2004 | Shimizu et al. | |
| 2006/0085155 A1* | 4/2006 | Miguelanez et al. | 702/118 |

\* cited by examiner

*Primary Examiner*—Bryan Bui
(74) *Attorney, Agent, or Firm*—W. James Brady, III; Frederick J. Telecky, Jr.

(57) ABSTRACT

Multiple parameters of manufactured units are continually measured until some of the units fail, where failure can be accelerated by adjusting operating conditions. Pre-failure data is then examined to find outliers or aberrant parameter values that may have contributed to the failures. The data is normalized to allow different parameters to be compared to one another. The parameters producing the highest outlier values are then used to screen subsequently manufactured units, thus significantly reducing the number of measurements that have to be taken to screen the units. Lower outlier values for these parameters are, however, used in screening subsequently manufactured units to "catch" potentially defective units.

20 Claims, 2 Drawing Sheets

|  | FAILED UNIT 1 | FAILED UNIT 2 | FAILED UNIT 3 | FAILED UNIT 4 | FAILED UNIT 5 | FAILED UNIT 6 | FAILED UNIT 7 |
|---|---|---|---|---|---|---|---|
| PARAMETER 1 | 6<br>5<br>5 | 3<br>4<br>5 | 6<br>5<br>4 | 6<br>5<br>5 | 3<br>4<br>5 | 4<br>5<br>6 | 5<br>6<br>5 |
| PARAMETER 2 | 5<br>7<br>6 | 7<br>7<br>8 | 9<br>8<br>7 | 4<br>3<br>6 | 4<br>4<br>5 | 5<br>5<br>6 | 3<br>5<br>3 |
| PARAMETER 3 | 5<br>6<br>4 | 6<br>5<br>4 | 3<br>4<br>5 | 4<br>5<br>4 | 3<br>4<br>5 | 5<br>6<br>5 | 5<br>3<br>3 |
| PARAMETER 4 | 6<br>3<br>4 | 5<br>5<br>6 | 5<br>4<br>3 | 5<br>4<br>4 | 6<br>5<br>5 | 5<br>5<br>6 | 4<br>5<br>6 |
| PARAMETER 5 | 5<br>4<br>4 | 6<br>5<br>3 | 4<br>6<br>3 | 5<br>4<br>6 | 5<br>5<br>6 | 5<br>4<br>6 | 5<br>6<br>5 |
| PARAMETER 6 | 5<br>5<br>6 | 3<br>3<br>6 | 5<br>6<br>5 | 6<br>7<br>6 | 7<br>7<br>8 | 6<br>5<br>8 | 9<br>7<br>6 |
| PARAMETER 7 | 3<br>5<br>3 | 4<br>4<br>6 | 3<br>4<br>6 | 6<br>5<br>5 | 4<br>6<br>5 | 5<br>5<br>6 | 5<br>3<br>6 |
| PARAMETER 8 | 5<br>5<br>6 | 6<br>5<br>4 | 6<br>4<br>4 | 4<br>5<br>4 | 5<br>3<br>4 | 6<br>5<br>5 | 5<br>6<br>4 |
| PARAMETER 9 | 6<br>5<br>5 | 4<br>4<br>6 | 3<br>5<br>4 | 5<br>5<br>6 | 6<br>4<br>5 | 4<br>6<br>4 | 4<br>5<br>4 |
| PARAMETER 10 | 4<br>5<br>4 | 4<br>3<br>5 | 5<br>5<br>6 | 3<br>5<br>4 | 5<br>6<br>4 | 5<br>5<br>6 | 4<br>5<br>3 |

OUTLIER SCREENING TECHNIQUE

FIELD OF INVENTION

The present invention relates generally to data analysis, and more particularly to determining screening parameters and parameter limits for screening manufactured units.

BACKGROUND OF THE INVENTION

It can be appreciated that quality control is an important aspect of manufacturing. It can also be appreciated that there can be significant costs associated with quality control, including, among other things, costs associated with discarding defective units and costs associated with testing units to see if they meet certain standards. Testing units may include, for example, generating and analyzing vast amounts of data regarding the units, which can consume valuable resources. Accordingly, techniques that streamline the testing process, among other things, would be desirable.

SUMMARY OF THE INVENTION

The following presents a simplified summary in order to provide a basic understanding of some aspects of the invention. This summary is not an extensive overview of the invention. It is intended to neither identify key or critical elements of the invention nor to delineate the scope of the invention. Rather, the primary purpose of this summary is to present some concepts of the invention in a simplified form as a prelude to the more detailed description that is presented later.

Multiple parameters of manufactured units are continually measured until some of the units fail, where failure can be accelerated by adjusting operating conditions. Pre-failure data is then examined to find outliers or aberrant parameter values that may have contributed to the failures. The data is normalized to allow different parameters to be compared to one another. The parameters producing the highest outlier values are then used to screen subsequently manufactured units, thus significantly reducing the number of measurements that have to be taken to screen the units. Lower outlier values for these parameters are, however, used in screening subsequently manufactured units to "catch" potentially defective units.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

BRIEF DESCRIPTION OF THE DRAWINGS

FIG. 2 is a chart illustrating exemplary normalized outlier values for failed units as described herein.

DETAILED DESCRIPTION OF THE INVENTION

Figure 1:
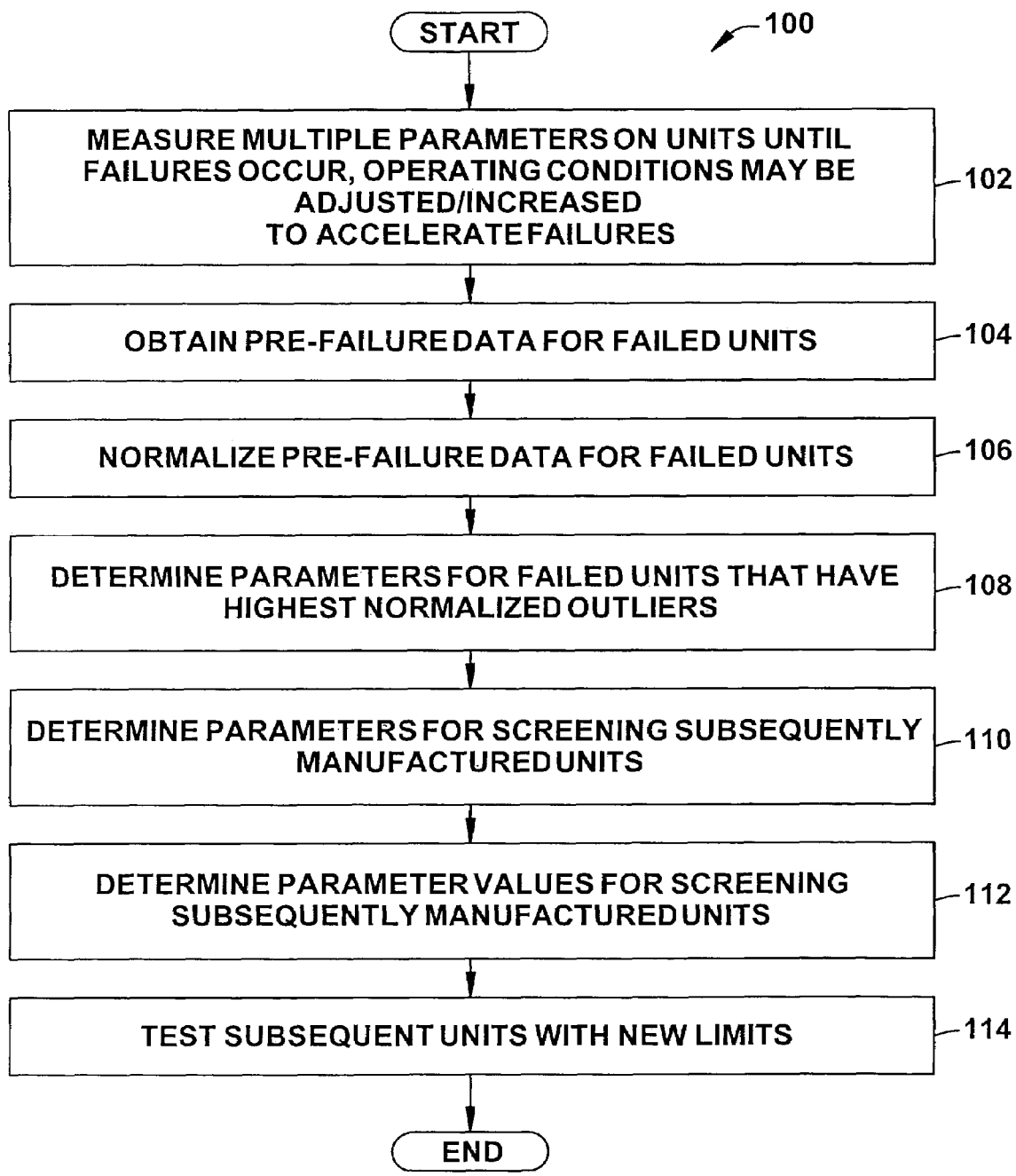
FIG. 1 is a flow diagram illustrating an exemplary methodology for screening outliers as described herein.

One or more examples are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more examples. It may be evident, however, to one skilled in the art that one or more examples may be practiced with a lesser degree of these specific details. In other instances, known structures and devices are illustrated to facilitate describing one or more examples.

An exemplary methodology 100 for determining screening parameters is illustrated in FIG. 1. While the method 100 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated acts may be required to implement a methodology disclosed herein. Further, one or more of the acts depicted herein may be carried out in one or more separate acts and/or phases.

Initially at 102 in the method 100, multiple parameters are measured on a plurality of manufactured units to facilitate quality control. By way of example, manufactured units may correspond to die on a semiconductor wafer, for example, where one or more copies of an integrated circuit may be formed on each die. After manufacturing, such die are generally cut from the wafer and sold to customers. In any event, the die may be tested before or after being cut from the wafer. There may be thousands of die on a single wafer, for example, where such a wafer may be round and have a diameter of about 300 millimeters, for example. Similarly, hundreds or thousands of operating parameters may be measure for each die, or rather the circuitry thereon. Additionally, hundreds or thousands of measurements may be taken for each of the operating parameters on each of the die. It can be appreciated that vast amounts of data can thus be generated for quality control purposes. A couple of such parameters may correspond to current drawn by the circuitry as well as voltage required to operate such circuitry, for example, where these parameters can affect battery life. As such, it can be appreciated that it is important for such parameters to operate within certain tolerances when the circuitry is used in small hand held devices, such as cellular telephones, for example.

Readings are taken for the multiple parameters on each of the manufactured units (e.g. die) until there are a few failures. It can be appreciated that a failure may be defined in any suitable manner, such as parameter value exceeding a customer's specification, for example. A cellular telephone manufacturer may require that circuitry used in their telephones not draw more than 100 milli amps of current, for example (e.g., so that the batteries in their phones last at least for some predefined period of time before having to be recharged). As such, a die or circuitry thereon may be considered to have failed if it draws more than 100 milli amps of current. Additionally, the manufacturer of the circuitry may set even tighter limits to promote customer (e.g., the cellular telephone manufacturer) satisfaction. As such, the manufacturer of the circuitry may consider a unit to have failed if it draws more than 80 milli amps of current, for example. Similarly, where the cellular telephone manufacturer requires that an operating voltage not exceed 50 milli volts, for example, then the manufacturer of the circuitry may consider a unit to have failed if the unit operates at 40 or more milli volts, for example. It will be appreciated that failures can be accelerated by operating the units under increasingly harsh or stressful operating conditions. For example, circuitry can be operated and measurements can be taken while the humidity, temperature, pressure, voltage, etc. are continually increased. It will also be appreciated, however, that accelerating failures is not necessary, but is merely a way to more quickly acquire data (e.g., multiple test points).

Once a few failures have occurred, the method proceeds to 104 where pre-failure data is obtained. This corresponds to data that is acquired from the failed units, but before the units have actually failed. Where 7 units fail, for example, (e.g., out of a thousand units), then there would be 7 data sets, one for each of the 7 failed units. Each of the 7 data sets would contain multiple measurement values for each of the many parameters measured on each of the 7 failed units. The number of values for each of the parameters measured on each of the 7 failed units corresponds to the number of measurements taken for each of the parameters on each of the 7 failed units before the failures occurred.

The pre-failure data from the failed units is then normalized at 106. Normalizing the data allows values for different parameters for respective failed units to be compared to one another. For example, where 7 units failed and two of the parameters correspond to current drawn and operating voltage, then normalizing the data allows the current and voltage values for the respective failed units to be compared to one another. It will be appreciated that the data can be normalized in any suitable manner, such as with Tukey IQR, surround by, and/or nearest neighbor, for example.

In any event, in normalizing the data, the values are weighted (e.g., on a basis of importance) to allow the different values to be compared to one another (e.g., apples to apples, rather than apples to oranges). As such, outlier values can be identified and compared to one another to find parameters of interest, where outliers correspond to aberrant values. Where, for example, the vast majority of current values typically fall between 15 and 30 milli amps and voltage values typically fall between 10 and 20 milli volts then a current of 75 milli amps and a voltage of 40 milli volts may be considered outliers. In the absence of normalizing the data, it would be difficult, if not impossible, to compare or rank the 75 milli amps to the 40 milli volts (e.g., to determine which of these values is considered to be a worse or further outlier—which implies a worse operating situation).

At this point there are 7 different sets of normalized data, one for each of the 7 failed units. Each set of normalized data comprises all the values for the different parameters that were measured or obtained before the respective devices failed, where these values have been normalized in some manner that allows them to be compared to one another. At 108, the normalized data sets are each examined to identify the parameters that correspond to the highest or most significant outliers for each of the failed units. Where, for the first failed unit, for example, the 75 milli amps has a normalized value of 14 and the 40 milli volts has a normalized value of 11, for example, then the parameter of current (e.g., parameter 1) is identified since it has a higher normalized outlier value. Similarly, if the highest normalized value for the second failed unit corresponds to the $5^{th}$ parameter, then this $5^{th}$ parameter is identified.

The parameters corresponding to the highest normalized outlier values are determined for each of the failed units. Then, at 110 these parameters are examined to determine what parameters are to be used to test or screen subsequently manufactured units. For example, where multiple failed units have the same parameter that corresponds to the highest outlier values, then that parameter is chosen to test the subsequently manufactured units. If parameter 14 produces the highest outlier value for units 1, 2 and 3, for example, then parameter 14 would be used to screen subsequently manufactured units. Similarly, if parameter 38 produces the highest outlier values for units 4, 5, 6 and 7, then subsequently manufactured units would be screened for parameter 38 as well as parameter 14. Nevertheless, it will be appreciated that the parameters that produce the highest outlier values may not be the same for any of the failed units. As such, multiple parameters (e.g., 7 different parameters, one from each of the 7 failed units) may be used to screen subsequently manufactured units.

Once the parameters that are going to be used to test subsequently manufactured units are determined, then the values of those parameters that indicate a potential failure are determined at 112. Turning to FIG. 2, for example, a table 200 illustrates exemplary normalized outlier values as described herein. In the illustrated example there are 7 respective data sets (e.g., columns) for 7 failed units. 10 parameters are measured for each of the 7 failed units, with 3 normalized outlier values illustrated for each of the 10 different parameters. The highest normalized outlier value for each of the 10 parameters for each of the failed units is in bold in the illustrated example.

It can be seen that parameter 2 produces the highest outlier values for failed units 1-3 in the illustrated example. Similarly, parameter 6 produces the highest outlier values for failed units 4-7 in the illustrated example. Accordingly, parameters 2 and 6 will be used to screen subsequently manufactured units. The lowest normalized values of parameters 2 and 6 will be used in screening subsequently manufactured units, however. For example, since parameter 2 has maximum normalized values of 7, 8 and 9 for failed units 1, 2 and 3 respectively, then a normalized value of 7 for parameter 2 will be used in screening subsequently manufactured units. Essentially, since unit 1 failed when it had a normalized value of 7 for parameter 2, subsequently manufactured units having normalized values of 7 or more for parameter 2 are deemed likely to be problematic and thus will be flagged. Similarly, since parameter 6 has maximum normalized values of 7, 8, 8 and 9 for failed units 4, 5, 6 and 7 respectively, then a normalized value of 7 for parameter 6 will likewise be used to screen subsequently manufactured units so that subsequently manufactured units having normalized values of 7 or more for parameter 6 are "caught" or flagged in the screening process.

The method then advances to 114 where subsequently manufactured units are screened using the determined parameters of interest and the lowest determined values for those parameters. By way of example, should parameter 2 of FIG. 2 correspond to current drawn by circuitry used in cellular telephones, and should normalized current values of 7, 8 and 9 correspond to currents of 50, 60 and 70 milli amps, for example, then subsequently tested units will be flagged if they draw more than 50 milli amps because there were failures at 50 milli amps and above. Similarly, should parameter 6 of FIG. 2 correspond to operating voltage of circuitry used in cellular telephones, and should normalized voltage values of 7, 8 and 9 correspond to voltages of 35, 40 and 45 milli volts, for example, then subsequently tested units will be flagged if they have operating voltages of more than 35 milli volts since there were failures at 35 milli volts and above, for example.

It can be appreciated that units having high outliers may be dubbed as walking wounded, since the outlier values provide an indication of quality or likelihood of failure. It can also be appreciated that merely outlier values may be normalized at 106, for example, instead of the entirety of the data sets since the more moderate parameter values are not likely to yield high normalized values. For example, more moderate current and voltage values (e.g., between around 15-30 milli amps and 10-20 milli volts) would yield normalized values of around 1 or lower. Further, it can be appreciated that typical statistical techniques are not effective/applicable to making the determinations provided herein since sample sizes are generally too small. Essentially, where there are only 6 failures out of hundreds or thousands of test units, a sample size of 6 units is too small to analyze.

In addition to identifying walking wounded or units that are likely to fail given their detected aberrant operating parameters, it can be appreciated that identifying the parameters of interest as described herein can be useful in adapting the manufacturing process to lower the number of units that may have to be discarded. More particularly, given knowledge of which manufacturing steps are likely to have an impact upon the determined parameters of interest, manufacturing processes can be adapted to mitigate aberrant values of those parameters. For example, tighter controls may be placed on one or more manufacturing steps that may contribute to the highest outlier values for parameters of interest. An annealing or heating process, for example, may be performed for a longer period of time and/or at higher temperatures, for example, to further harden a particular layer to inhibit current leakage, for example, to mitigate current drawn by circuitry.

It will be appreciated that the method can be expanded to include or address secondary outliers, or rather outliers that correspond to aberrant values, but just not the most aberrant values. For example, if the maximum outlier value is 9, but an outlier value of 8 exists, then the 8 outlier value can be investigated as described herein. This is true regardless of whether the 8 outlier value corresponds to the same or a different parameter than the parameter giving rise to the 9 outlier value. The method can continue to be extended in this manner to catch more units that may fail, but that have an increasingly lower probability of failing. Essentially, any suitable balance can be struck between mitigating failures (e.g., by identifying more outliers that have decreasing normalized values) and costs associated therewith (e.g., costs associated with scrapping more units that are identified as potential failures (but that have a lower and lower chance of actually failing) and/or costs associated with taking more measurements for more parameters, and thus analyzing more data).

In any event, it can be appreciated that identifying parameters of interest and respective values for those parameters as described herein can significantly reduce the time it takes to test units for quality control purposes. Associated testing costs are thus reduced, at least, by reducing the number of parameters that have to be tested/measured and thus the amount of data that has to be analyzed.

Although the invention has been shown and described with respect to one or more examples, equivalent alterations, modifications and/or implementations may occur to others skilled in the art based upon a reading and understanding of this specification and the annexed drawings. The invention includes all such modifications and alterations and is limited only by the scope of the following claims. In addition, while a particular feature or aspect of the invention may have been disclosed with respect to only one of several implementations, such feature or aspect may be combined with one or more other features or aspects of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, the term "exemplary" is merely meant to mean an example, rather than the best.

What is claimed is:

1. A method for screening manufactured units, comprising:

measuring multiple parameters on multiple manufactured units until some of the units fail;

obtaining pre-failure data for the failed units;

normalizing the pre-failure data for the failed units;

determining respective parameters for the failed units that give rise to the highest normalized outlier values;

finding parameters that give rise to the highest normalized outlier values for more than one failed unit to determine parameters of interest;

finding the lowest acceptable outlier values for the parameters of interest; and screening subsequently manufactured units with the parameters of interest, and with the lowest acceptable outlier values for the parameters of interest, thereby identifying potentially defective units for removal or further analysis.

2. The method of claim 1, further comprising:

finding parameters that give rise to secondary normalized outlier values to determine secondary parameters of interest.

3. The method of claim 1, where the pre-failure data is normalized such that the higher the normalized value, the more the outlier condition of the unit for the given parameter.

4. The method of claim 1, where the pre-failure data is normalized using any acceptable statistical outlier modeling technique.

5. The method of claim 4, where the pre-failure data is normalized with at least one of Tukey IQR, surround by and nearest neighbor.

6. The method of claim 1, where the pre-failure data is normalized with at least one of Tukey IQR, surround by and nearest neighbor.

7. The method of claim 2, where the pre-failure data is normalized with at least one of Tukey IQR, surround by and nearest neighbor.

8. The method of claim 1, where parameters of interest are merely respective parameters that give rise to the highest normalized outlier values for a failed unit, rather than parameters that give rise to the highest normalized outlier values for more than one failed unit.

9. The method of claim 1, further comprising:

accelerating failures by subjecting the units to increasingly harsh operating conditions.

10. The method of claim 2, further comprising:

accelerating failures by subjecting the units to increasingly harsh operating conditions.

11. The method of claim 6, further comprising:

accelerating failures by subjecting the units to increasingly harsh operating conditions.

12. The method of claim 7, further comprising:

accelerating failures by subjecting the units to increasingly harsh operating conditions.

13. The method of claim 1, further comprising:

adapting the manufacturing process given knowledge of which manufacturing stages are likely to have an impact upon the determined parameters of interest.

14. The method of claim 2, further comprising:

adapting the manufacturing process given knowledge of which manufacturing stages are likely to have an impact upon the determined parameters of interest.

15. The method of claim 6, further comprising:

adapting the manufacturing process given knowledge of which manufacturing stages are likely to have an impact upon the determined parameters of interest.

16. The method of claim 7, further comprising:

adapting the manufacturing process given knowledge of which manufacturing stages are likely to have an impact upon the determined parameters of interest.

17. The method of claim 9, further comprising:

adapting the manufacturing process given knowledge of which manufacturing stages are likely to have an impact upon the determined parameters of interest.

18. The method of claim 10, further comprising:

adapting the manufacturing process given knowledge of which manufacturing stages are likely to have an impact upon the determined parameters of interest.

19. The method of claim 11, further comprising:

adapting the manufacturing process given knowledge of which manufacturing stages are likely to have an impact upon the determined parameters of interest.

20. The method of claim 12, further comprising:

adapting the manufacturing process given knowledge of which manufacturing stages are likely to have an impact upon the determined parameters of interest.

* * * * *